(12) United States Patent
Lee et al.

(10) Patent No.: US 8,299,521 B2
(45) Date of Patent: Oct. 30, 2012

(54) NONVOLATILE MEMORY DEVICE AND METHOD OF FABRICATING THE SAME

(75) Inventors: Jung-hyun Lee, Suwon-si (KR);
Young-eal Kim, Yongin-si (KR);
Chang-soo Lee, Suwon-si (KR);
Dong-joon Ma, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 126 days.

(21) Appl. No.: 12/656,681

(22) Filed: Feb. 12, 2010

(65) Prior Publication Data
US 2010/0200908 A1 Aug. 12, 2010

(30) Foreign Application Priority Data
Feb. 11, 2009 (KR) .......... 10-2009-0011207

(51) Int. Cl.
*H01L 29/72* (2006.01)

(52) U.S. Cl. ........ 257/326; 257/324; 257/330; 438/270; 438/287; 365/185.05

(58) Field of Classification Search .................. 257/324, 257/326, 330; 438/270, 287; 365/185.05
See application file for complete search history.

(56) References Cited

U.S. PATENT DOCUMENTS
2008/0253183 A1* 10/2008 Mizukami et al. ....... 365/185.05
* cited by examiner

*Primary Examiner* — Edward Wojciechowicz
(74) *Attorney, Agent, or Firm* — Harness, Dickey & Pierce, P.L.C.

(57) ABSTRACT

Provided are a nonvolatile memory device having a vertical folding structure and a method of manufacturing the nonvolatile memory device. A semiconductor structure includes first and second portions that are substantially vertical. A plurality of memory cells are arranged along the first and second portions of the semiconductor structure and are serially connected.

18 Claims, 9 Drawing Sheets

NONVOLATILE MEMORY DEVICE AND METHOD OF FABRICATING THE SAME

CROSS-REFERENCE TO RELATED APPLICATIONS

This application claims priority to Korean Patent Application No. 10-2009-0011207, filed on Feb. 11, 2009, in the Korean Intellectual Property Office, the entire contents of which are incorporated herein by reference.

BACKGROUND

1. Field

Example embodiments relate to a semiconductor device, and more particularly, to a nonvolatile memory device.

2. Description of the Related Art

Electronic appliances are being reduced in size, but require high capacity data processing at the same time. Accordingly, a nonvolatile memory device used in the electronic appliances is reduced in volume. Thus, a nonvolatile memory device having a vertical structure instead of a planar structure may be considered to be used in the electronic appliances.

However, manufacturing a nonvolatile memory device having a vertical structure is complicated and, thus, price competitiveness and reliability thereof may be decreased.

SUMMARY

At least one example embodiment includes a nonvolatile memory device, with increased reliability and economic efficiency, and a method of manufacturing the nonvolatile memory device.

According to one or more example embodiment, a nonvolatile memory device includes a substrate, a semiconductor structure on the substrate, the semiconductor structure including first and second portions that are substantially vertical. A plurality of memory cells are arranged separately from each other along the first and second portions of the semiconductor structure and are serially connected to one another.

The nonvolatile memory device may further include a buried insulation layer disposed between the first and second portions of the semiconductor structure, and the plurality of memory cells are disposed on the first and second portions of the semiconductor structure on the opposite side of the buried insulation layer.

The nonvolatile memory device may further include a plurality of interlayer insulation layers formed between the plurality of memory cells. The semiconductor structure may further include first and second peak portions that are extended from an upper end of the first and second portions on uppermost portions on the plurality of the interlayer insulation layers.

The nonvolatile memory device may further include a string selection transistor on the first peak portion of the semiconductor structures and a grounding selection transistor on the second peak portion of the semiconductor structure.

The plurality of memory cells may have a vertical channel structure that extends along the first and second portions of the semiconductor structure, and the string selection transistor and the grounding selection transistor may include a planar channel structure that extends along the first and second peak portions of the semiconductor structure.

According to at least one example embodiment a method of manufacturing a nonvolatile memory device includes forming a semiconductor structure on the substrate, the semiconductor portion includes first and second portions that are vertical, and forming a plurality of memory cells that are separately arranged along the first and second portions of the semiconductor structure and are serially connected to one another.

A plurality of interlayer insulation layers and a plurality of sacrificial layers may be alternately stacked on the substrate and at least one trench is formed by etching the plurality of the interlayer insulation layers and the plurality of sacrificial layers. An amorphous semiconductor layer may be formed on an inner surface of the at least one trench. In addition, the semiconductor structure may be formed by crystallizing the amorphous semiconductor layer.

The amorphous semiconductor layer may be crystallized by electron beam annealing.

BRIEF DESCRIPTION OF THE DRAWINGS

Aspects will become apparent and more readily appreciated from the following description of example embodiments, taken in conjunction with the accompanying drawings of which.

DETAILED DESCRIPTION

Figure 1:
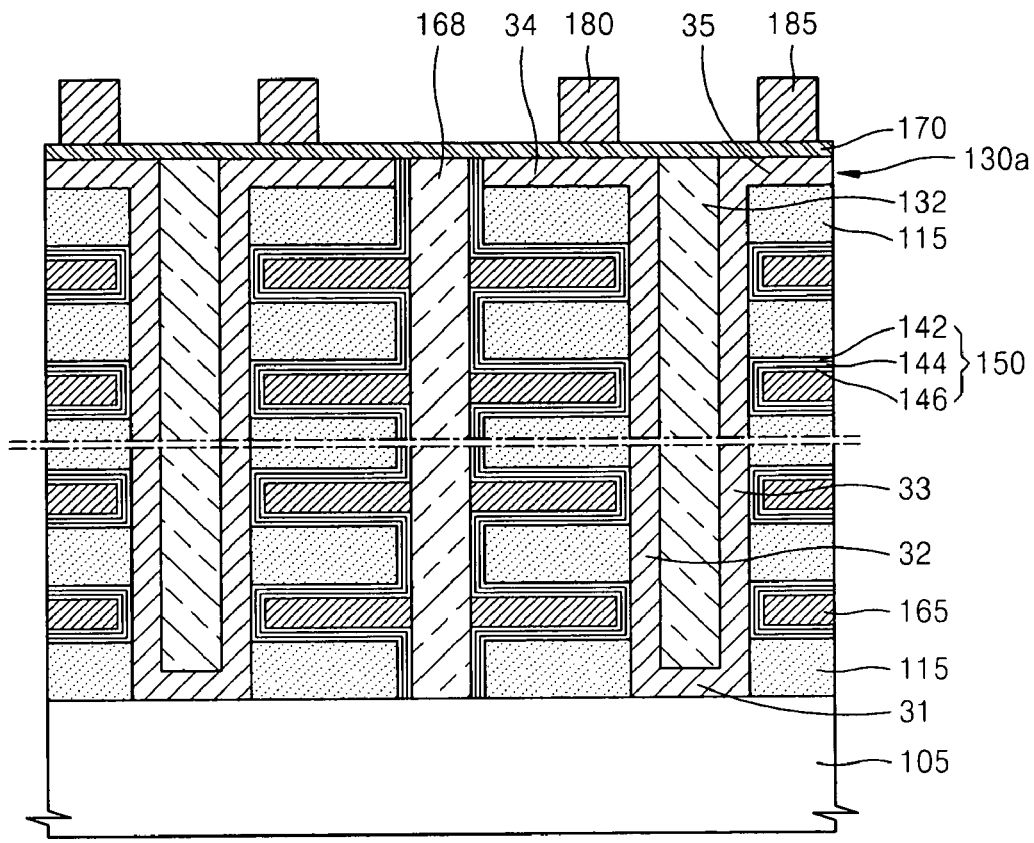
FIG. 1 is a cross-sectional view illustrating a nonvolatile memory device according to an example embodiment.

Example embodiments will now be described more fully with reference to the accompanying drawings. Many alternate forms may be embodied and example embodiments should not be construed as limited to example embodiments set forth herein. In the drawings, the thicknesses of layers and regions may be exaggerated for clarity, and like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein to describe one element or a relationship between a feature and another element or feature as illustrated in the figures. It will be understood that spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

It should also be noted that in some alternative implementations, the functions/operations noted may occur out of the order noted in the figures. For example, two figures shown in succession may in fact be executed substantially concurrently, or may sometimes be executed in reverse order, depending upon the functions/operations involved.

Figure 2:
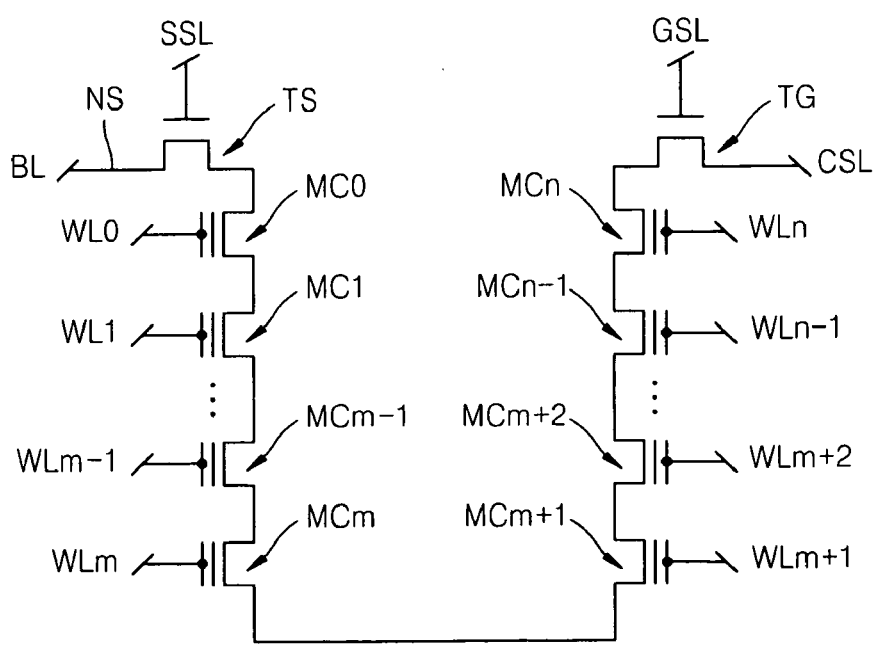
FIG. 2 is a circuit diagram illustrating the nonvolatile memory device of FIG. 1 according to an example embodiment.

FIG. 1 is a cross-sectional view illustrating a nonvolatile memory device according to an example embodiment, and FIG. 2 is a circuit diagram illustrating the nonvolatile memory device of FIG. 1 according to an example embodiment.

Referring to FIG. 1, a substrate 105 may be provided. The substrate 105 may include a semiconductor material such as a Group IV semiconductor, a Group III-V compound semiconductor, or a Group II-VI oxide semiconductor. Examples of Group IV semiconductor include silicon, germanium, and silicon-germanium. The substrate 105 may be a bulk wafer or an epitaxial layer.

At least one semiconductor structure 130a may be formed to have a folding structure that is vertically extended on the substrate 105. For example, the semiconductor structure 130a may include a bottom portion 31, a first portion 32, a second portion 33, a first peak portion 34, and a second peak portion 35. The bottom portion 31 is disposed on the substrate 105, and the first and second portions 32 and 33 may be vertically extended from both end portions of the bottom portion 31 above the substrate 105. A buried insulation layer 132 may be formed on the bottom portion 31 so as to fill a space between the first and second portions 32 and 33.

The first peak portion 34 may be extended substantially horizontally from an upper end of the first portion 32, and the second peak portion 35 may be extended substantially horizontally from an upper end of the second portion 33. The first and second peak portions 34 and 35 may be extended away from the first and second portions 32 and 33, respectively. The first and second peak portions 34 and 35 may be connected to a bit line BL and a common source line CSL, respectively, as illustrated in FIG. 2.

A plurality of control gate electrodes 165 may be disposed separately from each other along the first and second portions 32 and 33. For example, the control gate electrodes 165 may be symmetrically arranged on sides of the first and second portions 32 and 33 opposite where the buried insulation layer 132 is located. A number of the control gate electrodes 165 may be appropriately selected according to the capacity of the nonvolatile memory device, and is not limited to the number of the control gate electrodes 165 shown in FIG. 1.

A plurality of storage media 150 may be provided between the control gate electrodes 165 and the first and second portions 32 and 33. Each of the plurality of storage media 150 may include a tunneling insulation layer 142 on the first and second portions 32 and 33, a charge storage layer 144 on the tunneling insulation layer 142, and a blocking insulation layer 146 on the charge storage layer 144.

A plurality of interlayer insulation layers 115 may be provided between the stacked control gate electrodes 165. Moreover, each of the plurality of storage media 150 may be between a corresponding one of the plurality of control gate electrodes 165 and one of the plurality of interlayer insulation layers 115. The first and second peak portions 34 and 35 may be disposed on an uppermost portion of the interlayer insulation layers 115. Meanwhile, control gate electrodes 165 disposed on the same layer may be separated from one another by a device isolation layer 168.

Referring to FIGS. 1 and 2, the control gate electrodes 165 and the storage media 150 may form memory cells MC0-MCn. Accordingly, the memory cells MC0-MCn may be separately arranged along the first and second portions 32 and 33 and serially connected to one another. The control gate electrodes 165 may be coupled to words lines WL0-WLn.

The storage media 150 may be connected to one another along the first and second portions 32 and 33. For example, the storage media 150 may be extended so as to surround the control gate electrodes 165 from surfaces of the first and second portions 32 and 33, and then be extended along the first and second portions 32 and 33 and the interlayer insulation layers 115. That is, the storage media 150 may be curved over the first and second portions 32 and 33.

A PN type junction source/drain area which is formed by impurity doping may not be formed near surfaces of the first and second portions 31 and 32 between the control gate electrodes 165. Accordingly, the semiconductor structure 130a may be continuously doped with identical conductive impurities in order to form a well or a channel. In this case, the memory cells MC0-MCn may be connected to each other during a programming/reading operation by using a field effect type source/drain. A surface of the semiconductor structure 130a between the memory cells MC0-MCn may be turned on by a lateral electric field of the control gate electrodes 165, that is, a fringing field.

The charge storage layers 144 may have charge storage capability. For example, the charge storage layers 144 may be a trap type, and include, for example, a silicon nitride layer, quantum dots, or nanocrystals. The quantum dots or nanocrystals may be formed of a conductor, such as, fine particles of a metal or a semiconductor. Alternatively, the charge storage layers 144 may be a floating type, and include a doped polysilicon. When the charge storage layers 144 are the floating type, they are separated from each other. The tunneling insulation layers 142 and the blocking insulation layers 146 may include an oxide layer, a nitride layer, or a high-k dielectric layer. The high-k dielectric layer may refer to a dielectric layer having higher dielectric constant than that of an oxide layer or a nitride layer.

A string selection gate electrode 180 may be provided on the first peak portion 34, and a grounding selection gate electrode 185 may be provided on the second peak portion 35. A gate insulation layer 170 may be provided between the string selection gate electrode 180 and the first peak portion 34 and between the grounding selection gate electrode 185 and the second peak portion 35.

Referring to FIGS. 1 and 2, a stack structure of the string selection gate electrode 180 and the gate insulation layer 170 may form a string selection transistor TS, and a stack structure of the grounding selection gate electrode 180 and the gate insulation layer 170 may form a grounding selection transistor TG. The string selection gate electrode 180 may be coupled to a string selection line SSL, and the grounding selection gate electrode 185 may be coupled to a grounding selection line GSL.

As described above, the memory cells MC0-MCn may have a vertical channel structure extending vertically along the first and second portions 32 and 33. On the other hand, the string selection transistor TS and the grounding selection transistor TG may have a horizontal channel structure extending in a direction parallel to the substrate 105.

The string selection transistor TS, the memory cells MC0-MCn, and the grounding selection transistor TG may be serially connected, thereby forming a NAND string NS. According to example embodiments, a plurality of NAND strings may be arranged in a matrix.

Referring to FIG. 2, for a programming operation, 0 V is applied to the bit line BL, an on voltage is applied to the string selection line SSL, and an off voltage is applied to the grounding selection line GSL. An on voltage may be larger than or equal to a threshold voltage of the string selection transistor TS in order to turn on the string selection transistor TS, and an off voltage may be smaller than a threshold voltage of the grounding selection transistor TG in order to turn off the grounding selection transistor TG. Among the memory cells MC0-MCn, a programming voltage may be applied to selected memory cells MC0-MCn, and a pass voltage may be applied to the rest of the memory cells MC0-MCn. Charges may be injected into the memory cells MC0-MCn by F-N tunneling through the programming voltage. The pass voltage may be higher than a threshold voltage of the memory cells MC0-MCn.

For a reading operation, a reading voltage may be applied to the bit line BL, and an on voltage may be applied to the string selection line SSL and the grounding selection line GSL. Among the memory cells MC0-MCn, a reference voltage may be applied to selected memory cells MC0-MCn, and a pass voltage may be applied to the rest of the memory cells MC0-MCn.

For an erasing operation, an erasing voltage may be applied to bodies of the memory cells MC0-MCn, and 0 V may be applied to word lines WL0, WL1 WLn−1, and WLn. Accordingly, data of the memory cells MC0-MCn may be erased at once.

As the memory cells MC0-MCn are arranged in a folding structure, a vertical height of the NAND string may be reduced. Accordingly, the nonvolatile memory device may have a vertical structure with an adjusted height. Thus, reliability of the nonvolatile memory device may be increased.

FIGS. 3 through 12 are cross-sectional views illustrating a method of manufacturing a nonvolatile memory device according to an example embodiment. The method illustrated in FIGS. 3 through 12 may be used to form the nonvolatile memory device of FIG. 1.

Figure 3:
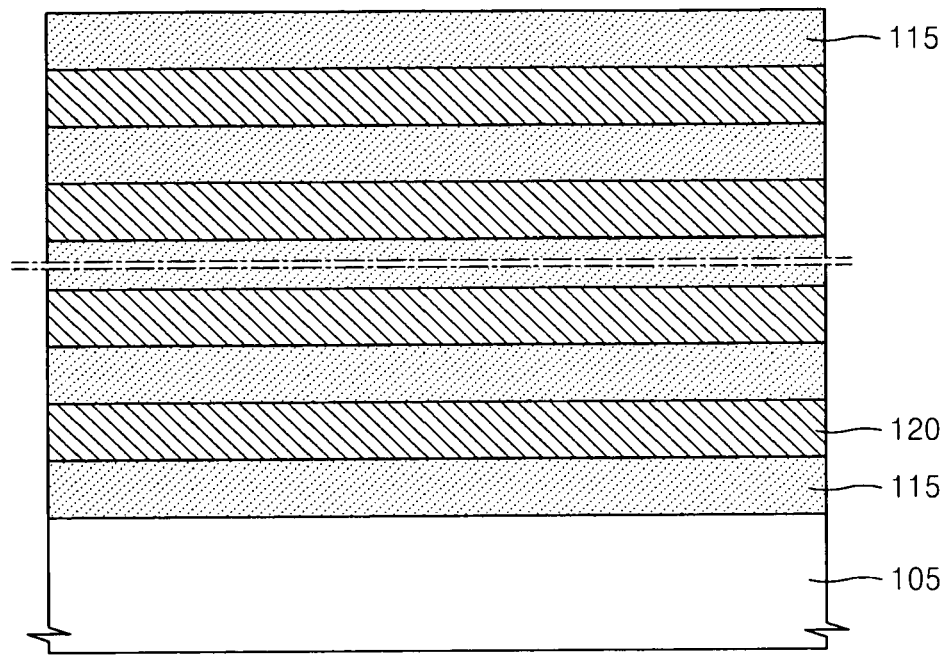
FIGS. 3 through 12 are cross-sectional views illustrating a method of manufacturing a nonvolatile memory device according to an example embodiment.

Referring to FIG. 3, interlayer insulation layers 115 and sacrificial layers 120 may be alternately stacked on the substrate 105. The sacrificial layers 120 may have an etching selectivity with respect to the interlayer insulation layers 115. For example, the interlayer insulation layers 115 may be an oxide, and the sacrificial layers 120 may be a nitride.

Figure 4:
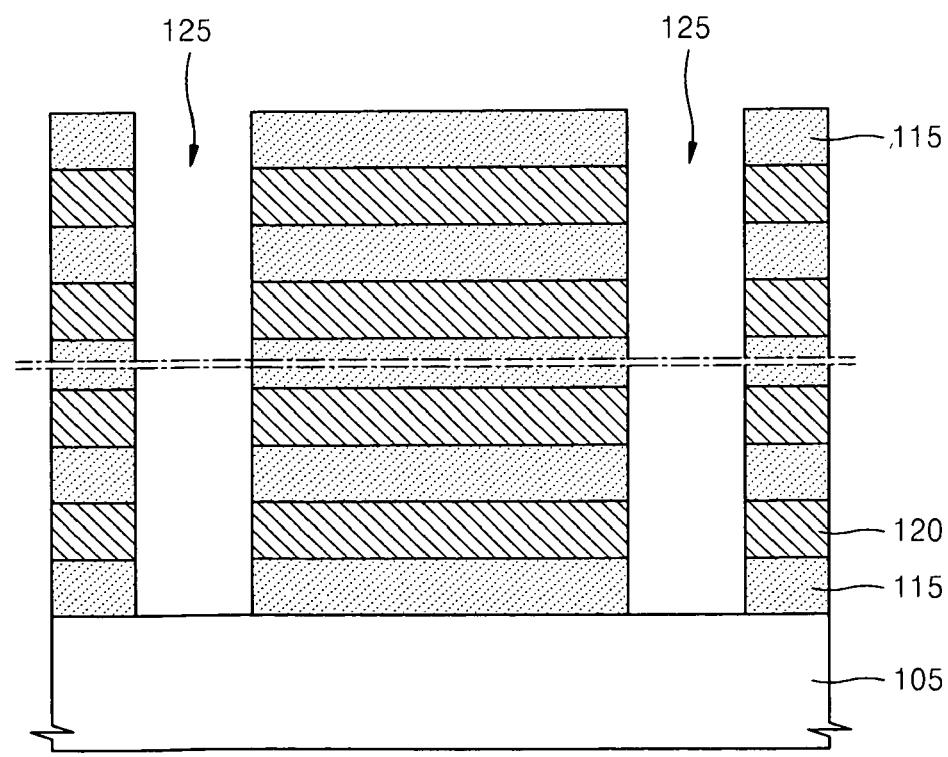

Referring to FIG. 4, the interlayer insulation layers 115 and the sacrificial layers 120 may be etched to form a plurality of first trenches 125. For example, the first trenches 125 may be formed by using photolithography and etching.

Figure 5:
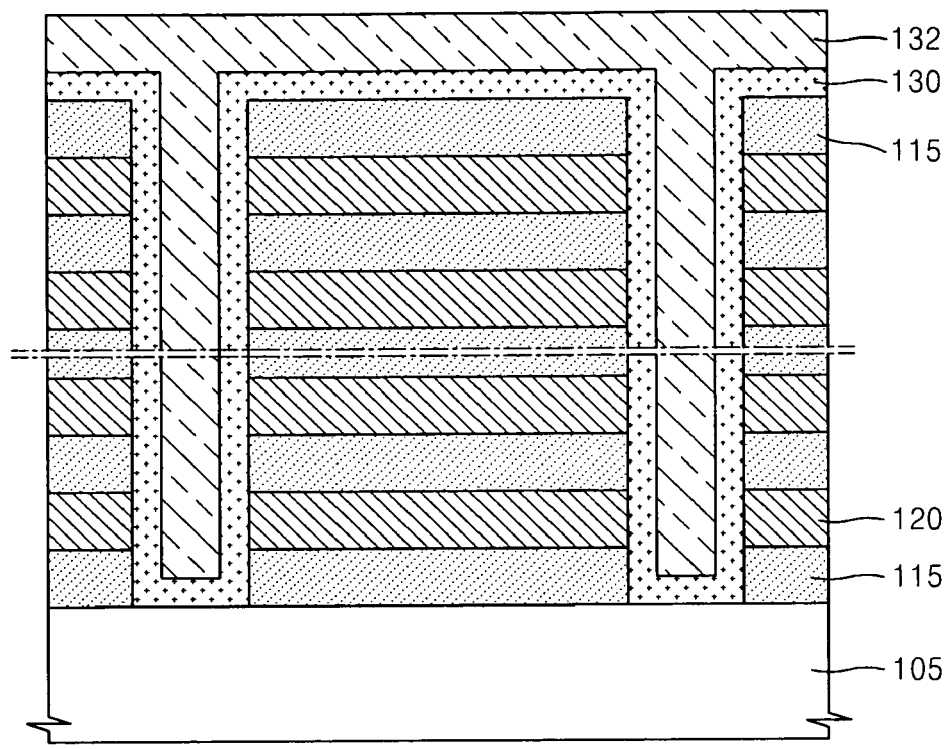

Referring to FIG. 5, an amorphous semiconductor layer 130 may be formed on an inner surface of the first trenches 125 and an uppermost portion of the interlayer insulation layers 115. Next, a buried insulation layer 132 may be formed on the amorphous semiconductor layer 130 so as to fill the first trenches 125. For example, the amorphous semiconductor layer 130 and the buried insulation layer 132 may be formed using a chemical vapor deposition (CVD) method.

Figure 6:
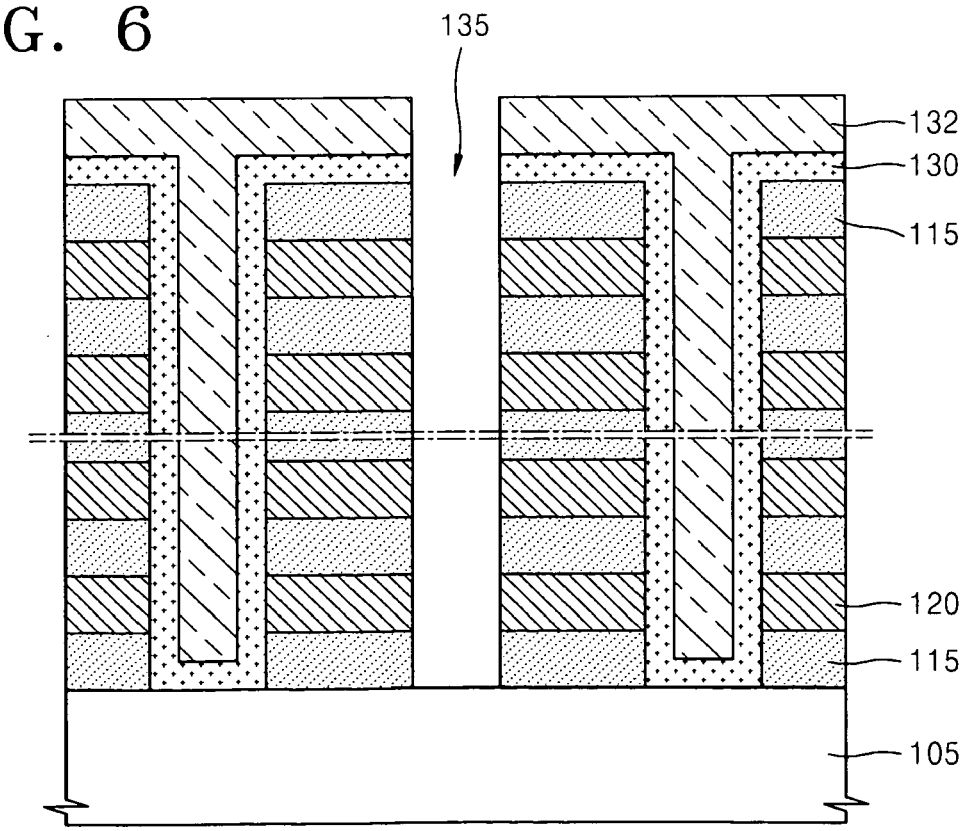

Referring to FIG. 6, at least one second trench 135 may be formed by etching the interlayer insulating layers 115 and the sacrificial layers 120 that are interposed between portions of the amorphous semiconductor layer 130, the amorphous semiconductor layer 130 and the buried insulation layer 132. For example, the second trench 135 may be formed by using photolithography and etching.

Figure 7:
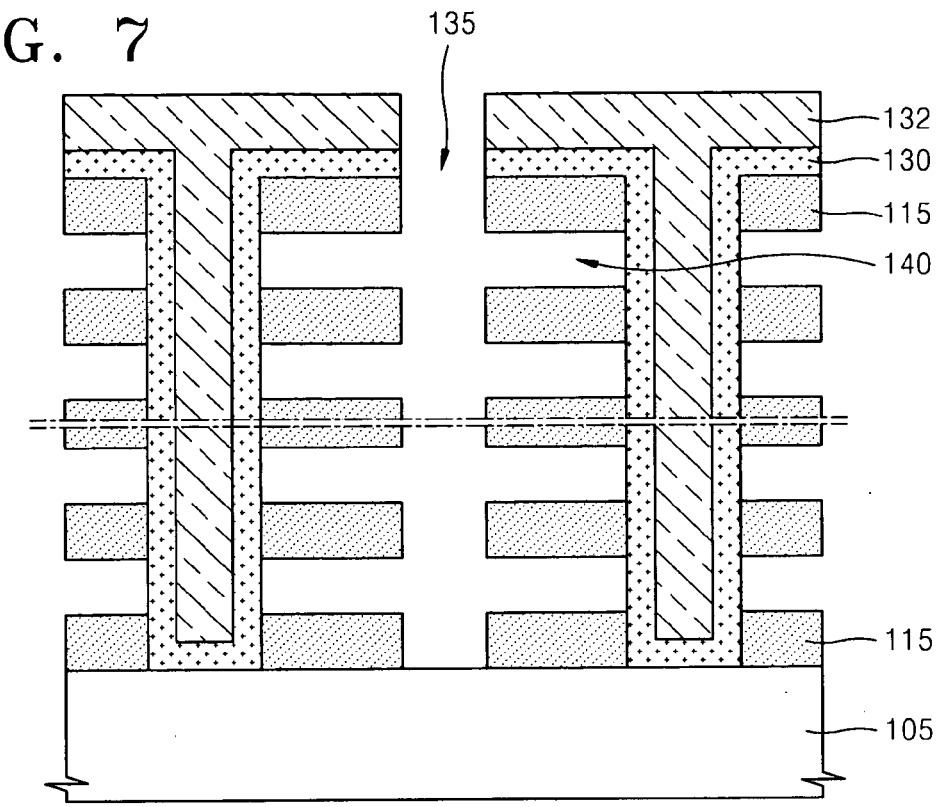

Referring to FIG. 7, while maintaining the interlayer insulation layers 115 and the buried insulation layers 132, the sacrificial layers 120 may be selectively removed. For example, by using an isotropic etching method, an etchant may be penetrated from the second trench 135, between the interlayer insulation layers 115. For example, the isotropic etching method may include a wet etching process or a chemical dry etching process. Accordingly, the sacrificial layers 120 between the interlayer insulation layers 115 are removed and, thus, a plurality of tunnels 140 that are connected to the second trench 135 may be formed. Sidewalls of the amorphous semiconductor layers 130 may be exposed by the tunnels 140.

Figure 8:
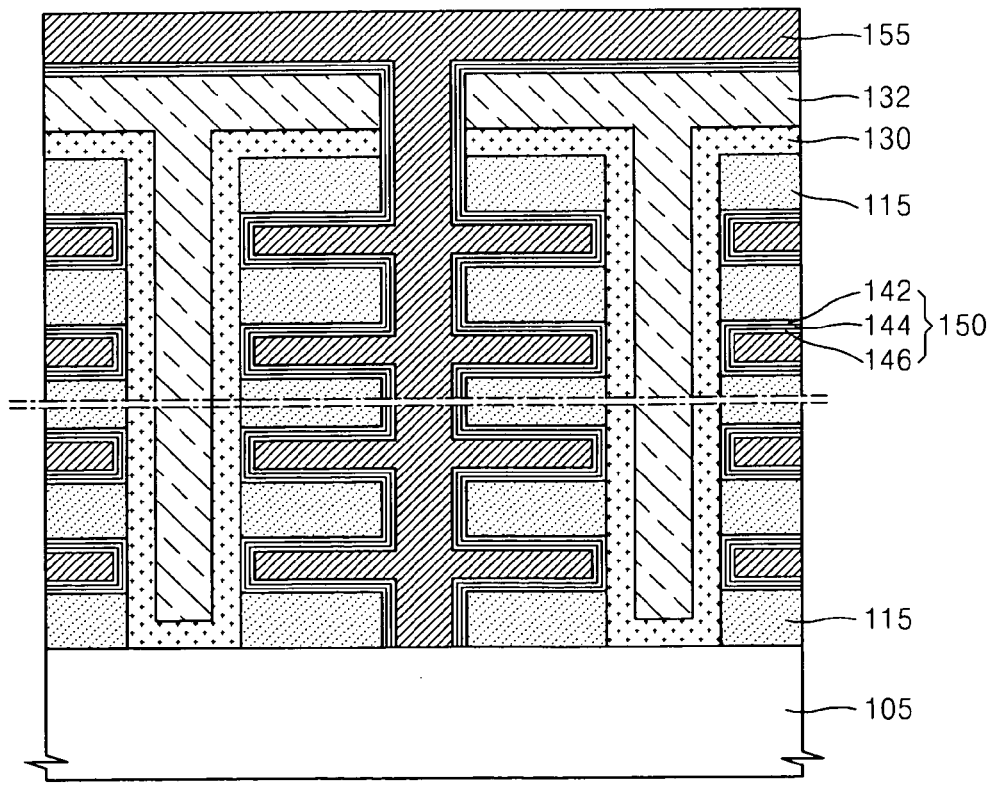

Referring to FIG. 8, the plurality of storage media 150 may be formed on the interlayer insulation layers 115 and the sidewalls of the amorphous semiconductor layer 130 that are exposed by the second trench 135 (see FIG. 7) and the tunnels 140 (see FIG. 7). The plurality of storage media 150 may be formed by sequentially depositing a tunneling insulation layer 142, the charge storage layer 144, and the blocking insulation layer 146. Next, a conductive layer 155 may be formed to fill the second trench 135 (see FIG. 7) and the tunnels 140. For example, the plurality of storage media 150 and the conductive layer 155 may be formed by using a CVD method or a plating method with high step coverage.

Accordingly, the height of the second trench 135 is lowered by half than that of a non-folding structure and, thus, an aspect ratio thereof is reduced. Accordingly, filling efficiency of the plurality of storage media 150 and the conductive layer 155 may be increased.

Figure 9:
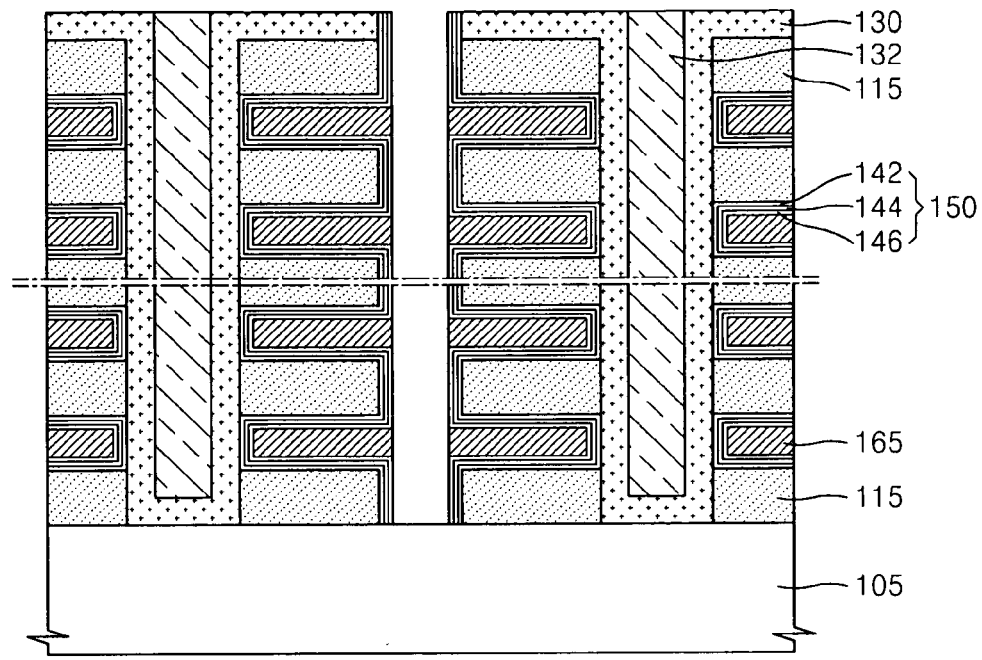

Referring to FIG. 9, the plurality of control gate electrodes 165 may be formed by, selectively etching the conductive layer 155 (see FIG. 8) exposed by the second trench 135 (see FIG. 7). Accordingly, the control gate electrodes 165 may be separated from one another.

Figure 10:
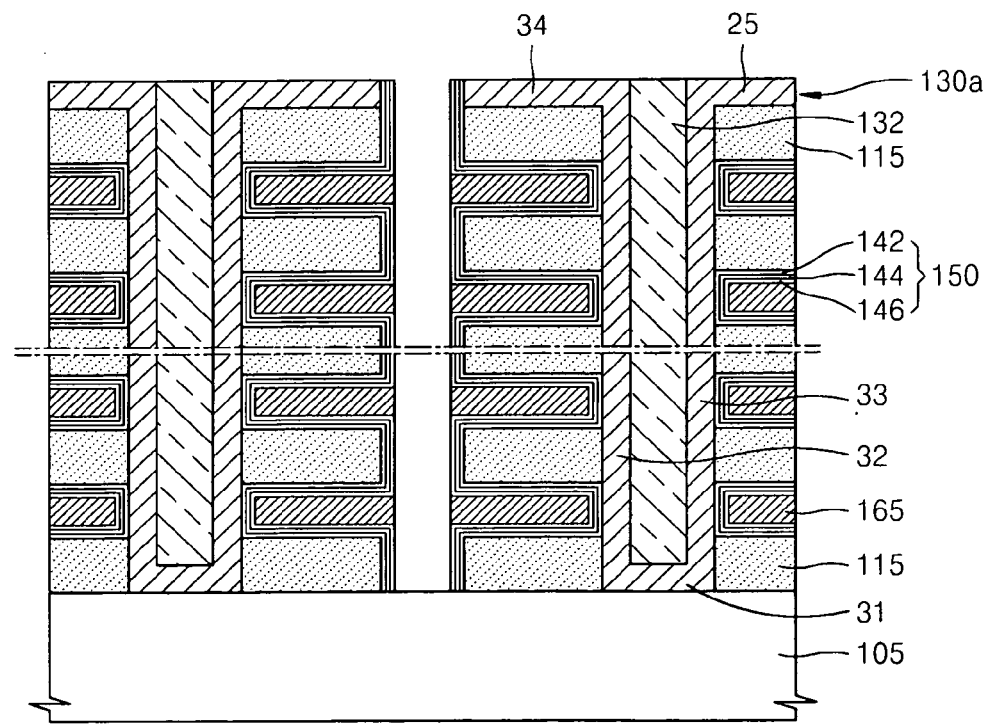

Referring to FIG. 10, the semiconductor structure 130a may be formed by crystallizing the amorphous semiconductor layer 130 of FIG. 9 by using electron beam annealing. The semiconductor structure 130a may include the bottom portion 31, the first and second portions 32 and 33, and the first and second peak portions 34 and 35.

Figure 13:
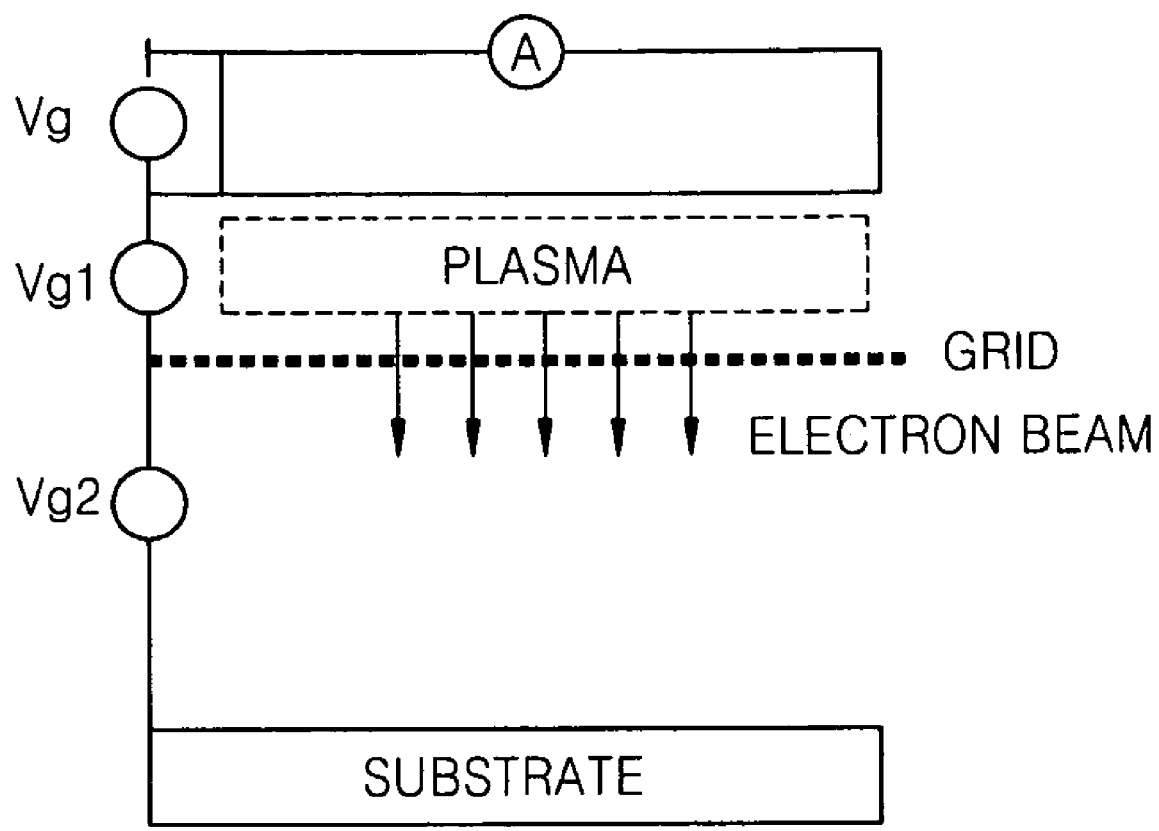
FIG. 13 is a schematic view illustrating an example embodiment of an electron beam extracting apparatus that is used in an operation illustrated in FIG. 10 of the manufacturing method of the nonvolatile memory device.

FIG. 13 is a schematic view illustrating an example embodiment of an electron beam extracting apparatus that is used in an operation illustrated in FIG. 10 of the manufacturing method of the nonvolatile memory device. The electron beam annealing may be performed by using the electron beam extracting apparatus illustrated in FIG. 13. Plasma may be formed on a substrate under an appropriate power condition and then an electron beam may be extracted through a grid.

By annealing the amorphous semiconductor layer 130 (see FIG. 9) by using the electron beam, heat may be transmitted from an upper portion of the amorphous semiconductor layer 130. Consequently, a semiconductor structure 130a having a uniform crystalline structure may be formed by reducing a size of nucleation on the amorphous semiconductor layer 130.

Figure 11:
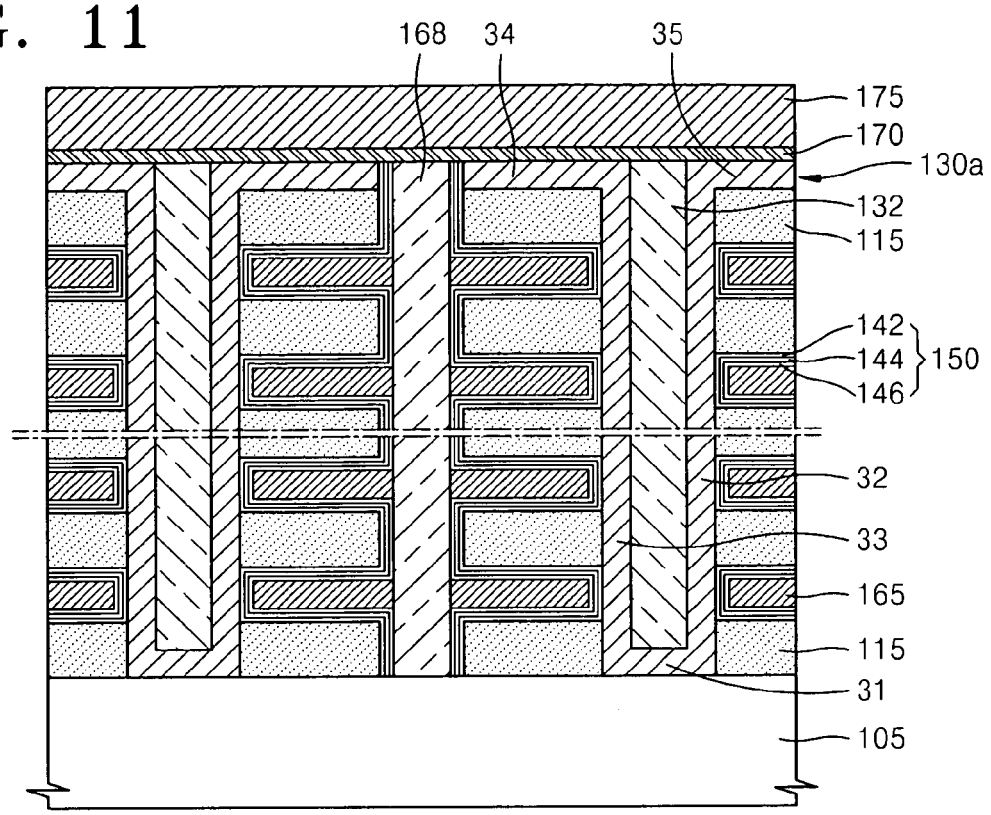

Referring to FIG. 11, the device isolation layer 168 may be formed between the separated control gate electrodes 165 to separate them from one another. Next, the gate insulation layer 170 and a second conductive layer 175 may be formed on the first peak portion 34 and the second peak portion 35.

Figure 12:
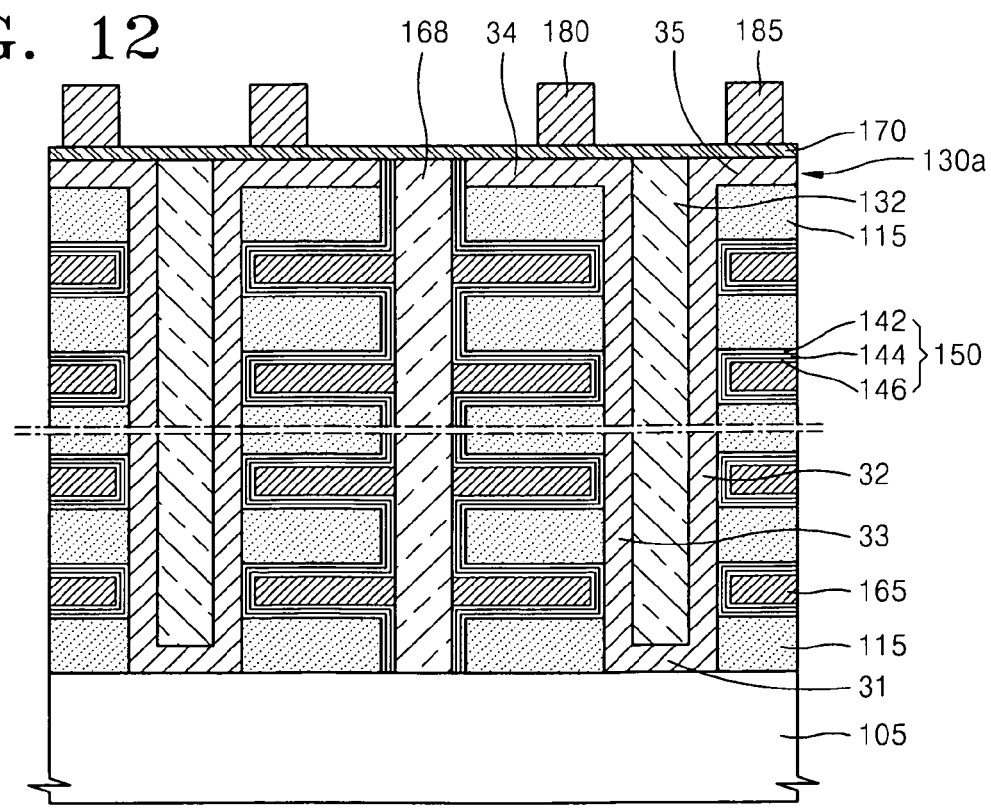

Referring to FIG. 12, the string selection gate electrode 180 and the grounding selection gate electrode 185 may be formed by patterning the second conductive layer 175. The second conductive layer 175 may be patterned by using photolithography and etching.

Figure 14:
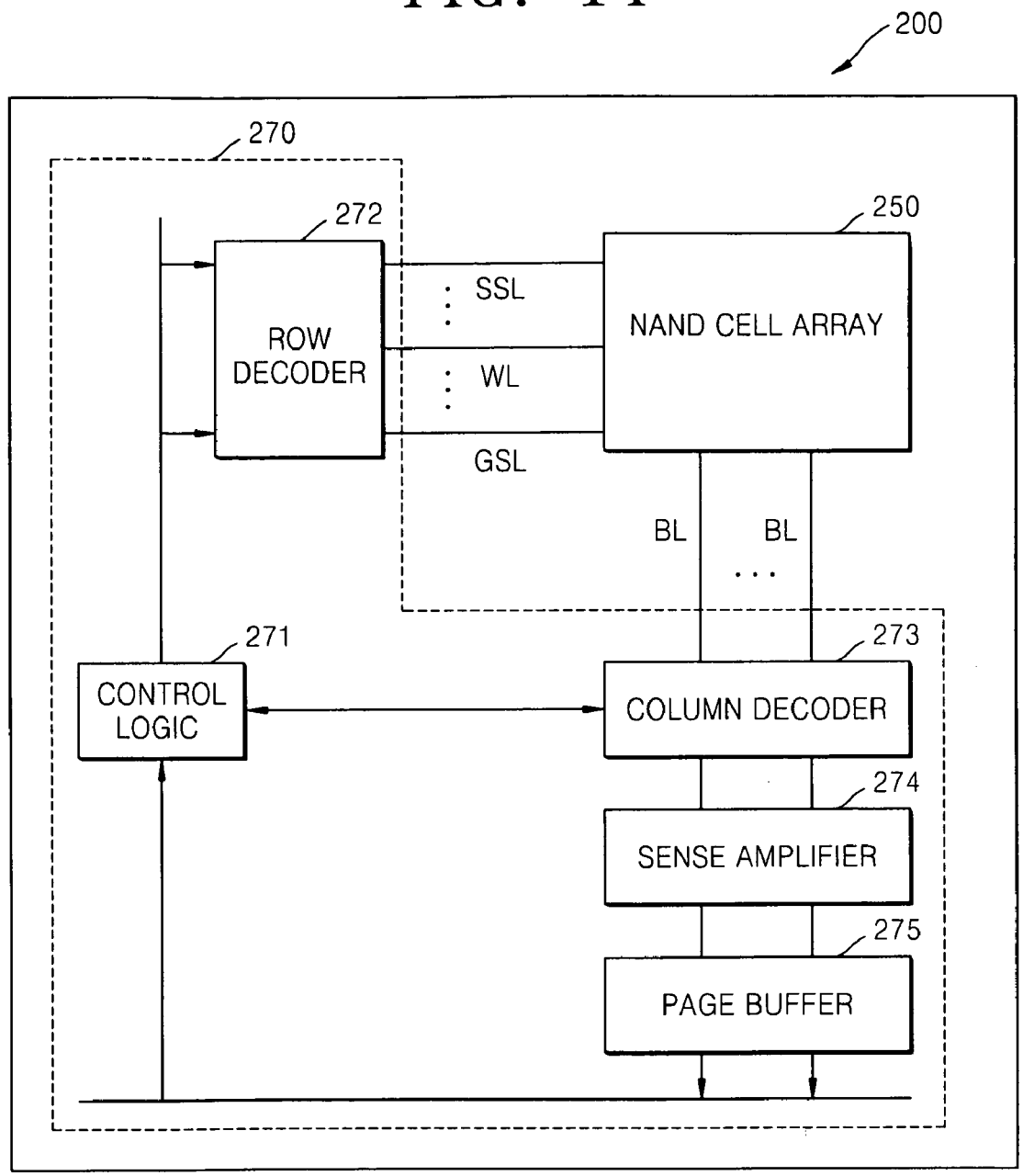
FIG. 14 is a block diagram illustrating a nonvolatile memory according to an example embodiment.

FIG. 14 is a block diagram illustrating a nonvolatile memory 200 according to an example embodiment.

Referring to FIG. 14, a NAND cell array 250 may be coupled to a core circuit unit 270. For example, the NAND cell array 250 may include the nonvolatile memory device shown in FIG. 1. The core circuit unit 270 may include a control logic 271, a row decoder 272, a column decoder 273, a sense amplifier 274, and a page buffer 275.

The control logic 271 may communicate with the row decoder 272, the column decoder 273, and the page buffer 275. The row decoder 272 may communicate with the NAND cell array 250 having a stack structure, via string selection lines SSL, word lines WL, and grounding selection lines GSL. The column decoder 273 may communicate with the NAND cell array 250 via bit lines BL. The sense amplifier 274 may be connected to receive an output from the column decoder 273 when a signal is output from the NAND cell array 250.

For example, the control logic 271 may transmit a row address signal to the row decoder 272, and the row decoder 272 may decode the row address signal and transmit the same to the string selection lines SSL, the word lines WL, and the grounding selection lines GSL. The control logic 271 may transmit a column address signal to the column decoder 273 or the page buffer 275, and the column decoder 273 may decode the column address signal and transmits the same to the NAND cell array 250 via the bit lines BL. Signals of the stack type NAND cell array 250 may be transmitted to the sense amplifier 274 via the column decoder 273, and be amplified and transmitted through the page buffer 275 to the control logic 271.

Figure 15:
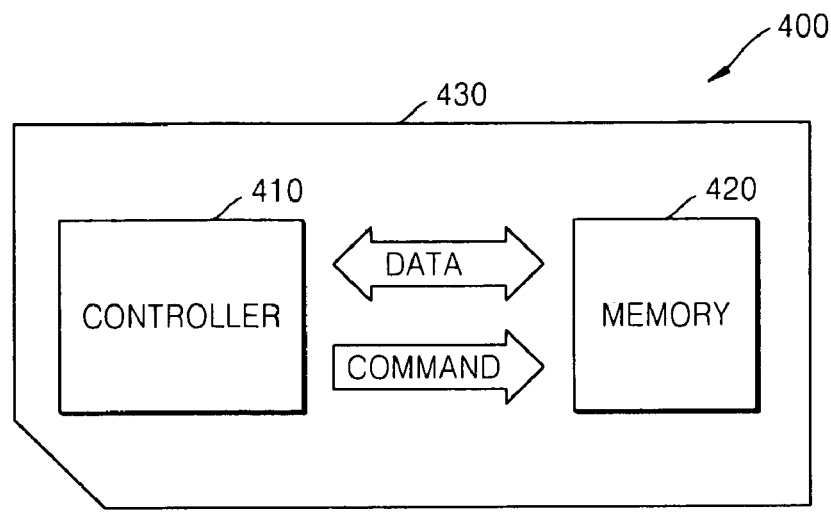
FIG. 15 is a schematic view illustrating a memory card according to an example embodiment.

FIG. 15 is a schematic view illustrating a memory card 400 according to an example embodiment.

Referring to FIG. 15, the memory card 400 may include a controller 410 and a memory unit 420 in a housing 430. The controller 410 and the memory unit 420 may exchange electrical signals with each other. For example, the memory unit 420 and the controller 410 may transmit and receive data to/from each other according to a command of the controller 410. Accordingly, the memory card 400 may store data in the memory unit 420 or output data from the memory unit 420 to the outside.

For example, the memory unit 420 may include the nonvolatile memory device 200 of FIG. 14. The memory card 400 may be used as a data storage medium of various types of portable appliances. For example, the memory card 400 may include a multi media card (MMC) or a secure digital (SD) card.

Figure 16:
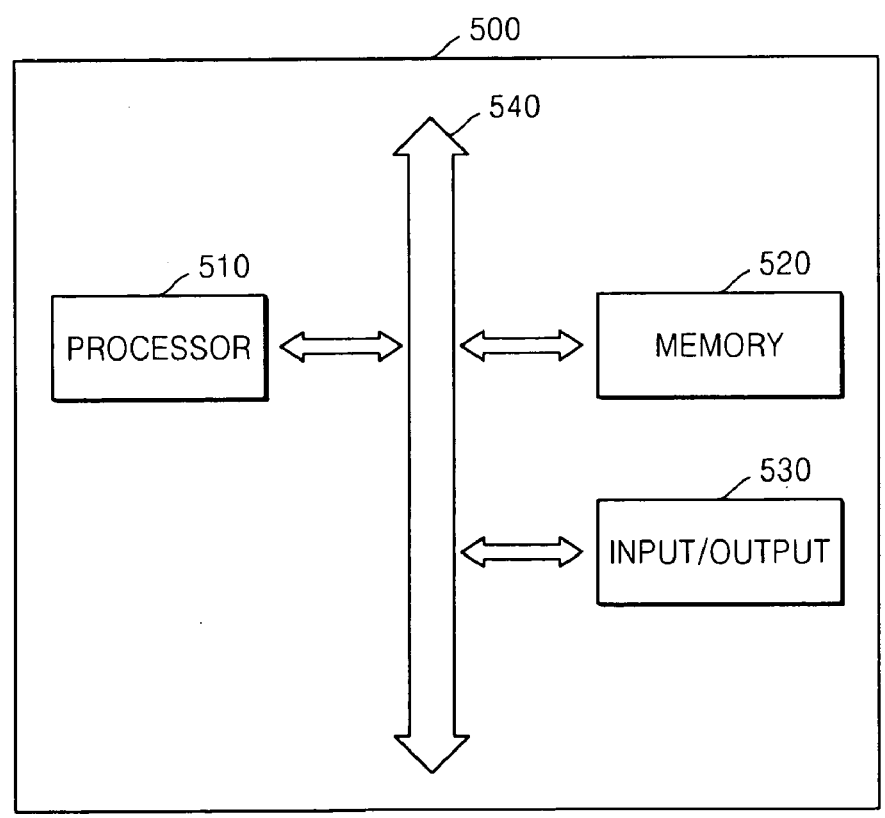
FIG. 16 is a block diagram illustrating an electronic system according to an example embodiment.

FIG. 16 is a block diagram illustrating an electronic system 500 according to an example embodiment.

Referring to FIG. 16, the electronic system 500 may include a processor 510, an input/output unit 530, and a memory unit 520. The processor 510, the input/output unit 530 and the memory unit 520 may process data communication with one another via a bus 540. The processor 510 may execute programs and control the electronic system 500. The input/output unit 530 may be used to input or output data of the electronic system 500. The electronic system 500 may be connected to an external device (e.g., a personal computer or a network) by using the input/output unit 530 and exchange data with the external device. The memory unit 520 may store codes and data for operating the processor 510. For example, the memory unit 520 may include the nonvolatile memory device 200 of FIG. 14.

For example, the electronic system 500 may constitute various types of electronic controllers that require the memory unit 520. For example, the electronic system 500 may be used in a mobile phone, an MP3 player, a navigation device, a solid state disk (SSD), or other household appliances.

It should be understood that example embodiments described therein should be considered in a descriptive sense only and not for purposes of limitation. While example embodiments have been shown and described, it will be understood that various changes in form and details may be made without departing from the spirit and scope of the following claims.

What is claimed is:

1. A nonvolatile memory device, comprising:
   a substrate;
   a semiconductor structure on the substrate, the semiconductor structure including first and second portions that are substantially vertical and face each other, and a bottom portion that connects the first and second portions; and
   a plurality of memory cells serially connected and arranged along the first and second portions of the semiconductor structure, each memory cell defined by,
      an active region defined by a part of one of the first and second portions of the semiconductor structure,
      a control gate electrode, and
      one of a plurality of storage media,
         the one of the plurality of storage media between the control gate electrode and the part of one of the first and second portions, and
         the one of the plurality of storage media covering at least one of an upper and a lower surface of the control gate electrode.

2. The nonvolatile memory device of claim 1, further comprising:
   a buried insulation layer between the first and second portions of the semiconductor structure, and the plurality of memory cells are on sides of the first and second portions of the semiconductor structure that are on the opposite side of the buried insulation layer.

3. The nonvolatile memory device of claim 1, wherein the plurality of storage media are connected on the first and second portions of the semiconductor structure.

4. The nonvolatile memory device of claim 3, wherein the plurality of storage media surround the plurality of control gate electrodes and are curved over the first and second portions of the semiconductor structure.

5. The nonvolatile memory device of claim 1, wherein at least one of the plurality of storage media includes,
a tunneling insulation layer on one of the first and second portions of the semiconductor structure,
a charge storage layer on the tunneling insulation layer, and
a blocking insulation layer on the charge storage layer.

6. The nonvolatile memory device of claim 1, further comprising:
a plurality of interlayer insulation layers between the plurality of memory cells.

7. The nonvolatile memory device of claim 6, wherein the semiconductor structure includes first and second peak portions extending from upper ends of the first and second portions on the plurality of the interlayer insulation layers.

8. The nonvolatile memory device of claim 7, further comprising:
a string selection transistor,
the string selection transistor containing an active region defined by the first peak portion of the semiconductor structure; and
a grounding selection transistor,
the grounding selection transistor containing an active region defined by the second peak portion of the semiconductor structure.

9. The nonvolatile memory device of claim 8, wherein the string selection transistor and the grounding selection transistor form a planar channel structure that extends along the first and second peak portions of the semiconductor structure.

10. The nonvolatile memory device of claim 1, wherein the plurality of memory cells form a vertical channel structure that extends along the first and second portions of the semiconductor structure.

11. A method of manufacturing a nonvolatile memory device, the method comprising:
forming a semiconductor structure on a substrate, the semiconductor structure including first and second portions that are substantially vertical and face each other, and bottom portion that connects the first and second portions; and
forming a plurality of memory cells that are arranged along the first and second portions of the semiconductor structure and are serially connected, each memory cell defined by,
an active region defined by a part of one of the first and second portions of the semiconductor structure,
a control gate electrode, and
one of a plurality of storage media,
the one of the plurality of storage media between the control gate electrode and the part of one of the first and second portions, and
the one of the plurality of storage media covering at least one of an upper and a lower surface of the control gate electrode.

12. The method of claim 11, further comprising:
alternately stacking a plurality of interlayer insulation layers and a plurality of sacrificial layers on the substrate;
forming at least one trench by etching the plurality of the interlayer insulation layers and the plurality of sacrificial layers; and
forming an amorphous semiconductor layer on an inner surface of the at least one trench,
wherein the forming the semiconductor structure includes crystallizing the amorphous semiconductor layer.

13. The method of claim 12, wherein the crystallizing the amorphous semiconductor layer includes electron beam annealing.

14. The method of claim 12, further comprising:
forming a buried insulation layer to fill the at least one trench before crystallizing the amorphous semiconductor layer.

15. The method of claim 12, further comprising:
forming a plurality of tunnels that are connected to the at least one trench by selectively removing the plurality of sacrificial layers before crystallizing the amorphous semiconductor layer;
forming the plurality of storage media in the plurality of tunnels; and
forming a plurality of the control gate electrodes on the plurality of storage media.

16. The method of claim 12, wherein the semiconductor structure is formed to include first and second peak portions extending from upper ends of the first and second portions on the plurality of interlayer insulation layers.

17. The method of claim 16, further comprising:
forming a string selection transistor,
the string selection transistor containing an active region defined by the first peak portion of the semiconductor structure; and
forming a grounding selection transistor,
the grounding selection transistor containing an active region defined by the second peak portion of the semiconductor structure.

18. A nonvolatile memory device, comprising:
a substrate;
a semiconductor structure on the substrate, the semiconductor structure including first and second portions that are substantially vertical and face each other,
a bottom portion that connects the first and second portions, and
a first peak portion extending horizontally from an upper end of the first portion; and
a plurality of memory cells serially connected and arranged along the first and second portions of the semiconductor structure,
each memory cell containing an active region defined by a part of one of the first and second portions of the semiconductor structure;
a string selection transistor including a horizontal active region,
the horizontal active region defined by a part of the first peak portion of the semiconductor structure.

* * * * *